(12) United States Patent
Martinez et al.

(10) Patent No.: US 10,424,438 B2
(45) Date of Patent: Sep. 24, 2019

(54) REDUCED ELECTRICAL TERMINATIONS IN SURFACE-MOUNT TECHNOLOGY COMPONENTS

(71) Applicant: Apple Inc., Cupertino, CA (US)

(72) Inventors: Paul A. Martinez, Morgan Hill, CA (US); Curtis C. Mead, Sacramento, CA (US); Scott D. Morrison, Santa Cruz, CA (US); Giancarlo F. De La Cruz, San Jose, CA (US); Lin Chen, Saratoga, CA (US); Albert Wang, Sunnyvale, CA (US); Brad W Simeral, San Francisco, CA (US); Vu Vo, Cupertino, CA (US); Wyeman Chen, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 165 days.

(21) Appl. No.: 15/275,369

(22) Filed: Sep. 24, 2016

(65) Prior Publication Data

US 2017/0208690 A1 Jul. 20, 2017

Related U.S. Application Data

(60) Provisional application No. 62/280,037, filed on Jan. 18, 2016.

(51) Int. Cl.
| | |
|---|---|
| *H01G 4/232* | (2006.01) |
| *H01G 4/012* | (2006.01) |
| *H01G 4/30* | (2006.01) |
| *H01G 2/06* | (2006.01) |
| *H05K 3/34* | (2006.01) |

(52) U.S. Cl.
CPC ............. *H01G 4/232* (2013.01); *H01G 2/065* (2013.01); *H01G 4/012* (2013.01); *H01G 4/30* (2013.01); *H05K 3/3442* (2013.01); *H05K 2201/10015* (2013.01); *H05K 2201/10636* (2013.01)

(58) Field of Classification Search
CPC ........... H01G 4/30; H01G 4/228; H01G 4/232
See application file for complete search history.

(56) References Cited

U.S. PATENT DOCUMENTS

| | | | |
|---|---|---|---|
| 5,842,274 A | 12/1998 | Mödl et al. | |
| 6,829,134 B2 * | 12/2004 | Yamauchi | H01G 4/012 361/303 |
| 2003/0201303 A1 | 10/2003 | Jones et al. | |
| 2006/0139849 A1 * | 6/2006 | Yoon | H01G 4/232 361/306.3 |
| 2008/0174932 A1 * | 7/2008 | Kim | H01G 2/06 361/301.3 |

(Continued)

FOREIGN PATENT DOCUMENTS

JP 2007103496 A * 4/2007 ............... H01G 4/30

*Primary Examiner* — Eric W Thomas
(74) *Attorney, Agent, or Firm* — Fletcher Yoder PC

(57) ABSTRACT

Systems and methods described in this disclosure are related to fabrication and utilization of two-terminal electrical components that may have terminations with reduced width. Components, such as the ones described herein may be used to increase the density of components in electrical devices, as they may reduce a separation distance between devices that lead to solder bridging. Methods for fabrication are also described, including the use of ceramic layers that may provide reduction in parasitic capacitance and/or inductances.

18 Claims, 10 Drawing Sheets

(56) References Cited

U.S. PATENT DOCUMENTS

| | | | |
|---|---|---|---|
| 2013/0286535 A1* | 10/2013 | Chung | H01G 4/005 361/301.4 |
| 2014/0002952 A1* | 1/2014 | McConnell | B23K 1/0016 361/301.4 |
| 2014/0041915 A1* | 2/2014 | Hattori | H05K 1/18 174/260 |
| 2015/0008024 A1* | 1/2015 | Park | H01G 4/01 174/260 |
| 2015/0016016 A1* | 1/2015 | Lee | H01G 4/385 361/301.4 |

* cited by examiner

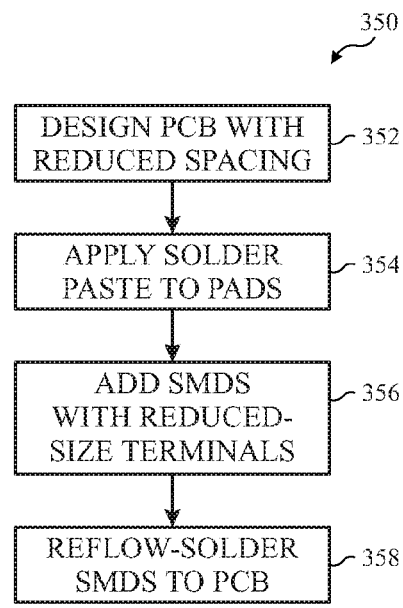
*FIG. 17*
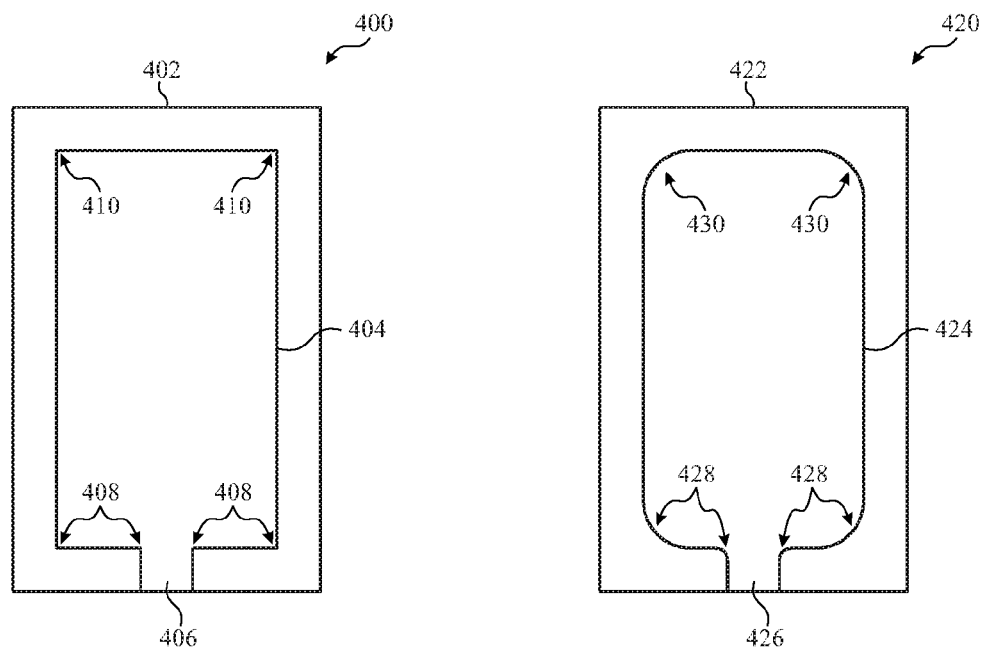
*FIG. 18*          *FIG. 19*

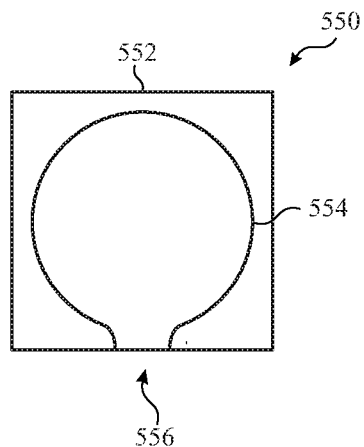
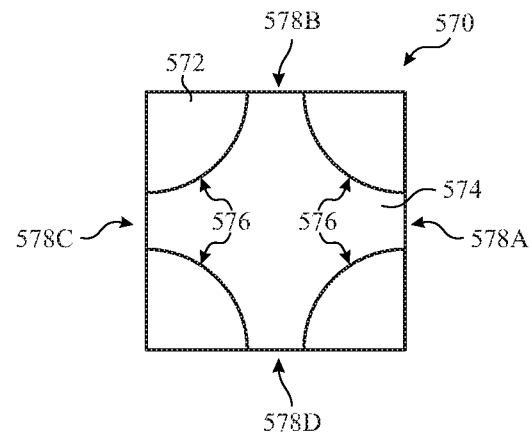
FIG. 22          FIG. 23
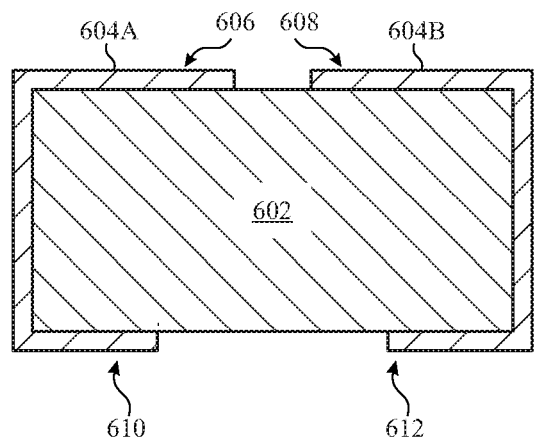
FIG. 24

REDUCED ELECTRICAL TERMINATIONS IN SURFACE-MOUNT TECHNOLOGY COMPONENTS

CROSS-REFERENCE TO RELATED APPLICATIONS

This application claims the benefit of U. S. Provisional Application No. 62/280,037 entitled "Method and Process for Reducing Solder Bridging between Surface Mount Technology Components" filed on Jan. 18, 2016, which is incorporated by reference herein its entirety for all purposes

BACKGROUND

The present disclosure relates generally to packaging of electrical devices and techniques for attachment to a circuit board or integrated circuit. More specifically, techniques for the design and fabrication of electrical terminations and/or connections of that may be used for surface-mount technologies (SMT) and other packaging standards and techniques are described.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Proper attachment of an electrical component to a printed circuit board (PCB) may employ an electrical pad on the PCB with a footprint that corresponds to the metallization located in the bottom of the electrical component. The footprint shape may also depend on a mount technique standard and/or the method to mount the electrical component to the PCB. For example, in electrical components that may use a surface-mount technique (SMT) the metallization on the bottom of SMT components usually extend from one end of the device to the other. As a result, the SMT pad on the PCB, as well as the corresponding solder junction between the SMT component and the PCB, may have a large footprint having a large metallization area.

During the process of attaching electrical components to the PCB, separation between neighboring electrical pads may be useful to prevent fabrication damages. For example, if two neighboring electrical pads are too close, the soldering process may result in the generation of an unintended short-circuit from residuals of the solder flux (e.g., solder bridging). The potential for solder bridging may increase the minimum distance between two neighboring electrical components, and consequently, limit the component density in the PCB. This may lead to electrical devices with large PCBs.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, an electrical component is provided. The electrical component may have a first electrical termination disposed along the bottom of the electrical component and extending to a first terminal edge that abuts a first end of the electrical component. The electrical component may also have a second electrical termination disposed along the bottom of the electrical component and extending to a second terminal edge of the electrical component that abuts a second end of the electrical component. The second end of the electrical component may be located opposite to the first end of the electrical component. In this embodiment, the first electrical termination may be located at a distance from both ends of the first terminal edge such that the distance is at least 10% of the total length of the first terminal edge. Note that the distance may be measured along the first terminal edge.

In another embodiment, a multilayer ceramic capacitor (MLCC) is provided. The MLCC may have a first layer that includes a first electrode provided with a first lip coupled to a first electrical termination along a first edge of the first layer. The MLCC may also have a second layer that includes a second electrode provided with a second lip and may be coupled to a second electrical termination along a second edge of the second layer. The dimension of the first lip measure along the first edge may be less than the length of the first edge and a second dimension of the second lip measured along the second edge may be less than the length of the second edge.

In another embodiment, a method is provided. The method may include steps for mounting a first surface mount device (SMD) to a first electrical pad of a printed circuit board (PCB). The first SMD may have terminations such that the total width of each termination is smaller than the width of the first SMD. The method may also include steps for mounting a second SMD to a second electrical pad of the PCB. The second SMD may also have terminations such that the total width of each termination is smaller than the width of the second SMD. Note that, in this method, the distance between the first electrical pad and the second electrical pad may be smaller than a metal-to-metal distance chosen to prevent formation of a solder bridge between the first and the second electrical pad.

BRIEF DESCRIPTION OF THE DRAWINGS

Various aspects of this disclosure may be better understood upon reading the following detailed description and upon reference to the drawings in which:

FIG. 17 illustrates a method for mounting two-terminal components having reduced terminations, such as the ones from FIGS. 11-13, in accordance with an embodiment;

FIG. 18 presents a layout of a reduced tip electrode that may be used with any of the electrical components illustrated in FIGS. 1-15, in accordance with an embodiment;

FIG. 19 presents another layout for a reduced tip electrode that may be used with any of the electrical components illustrated in FIGS. 1-15, in accordance with an embodiment;

FIG. 22 presents another layout for reduced tip electrodes that may be used with any of the electrical components illustrated in FIGS. 1-15, in accordance with an embodiment;

FIG. 23 presents another layout for reduced tip electrodes that may be used with any of the electrical components illustrated in FIGS. 1-15, in accordance with an embodiment; and FIG. 24 presents a side view of a two-terminal component with extended terminations along the top for stacking, in accordance with an embodiment.

DETAILED DESCRIPTION

Figure 1:
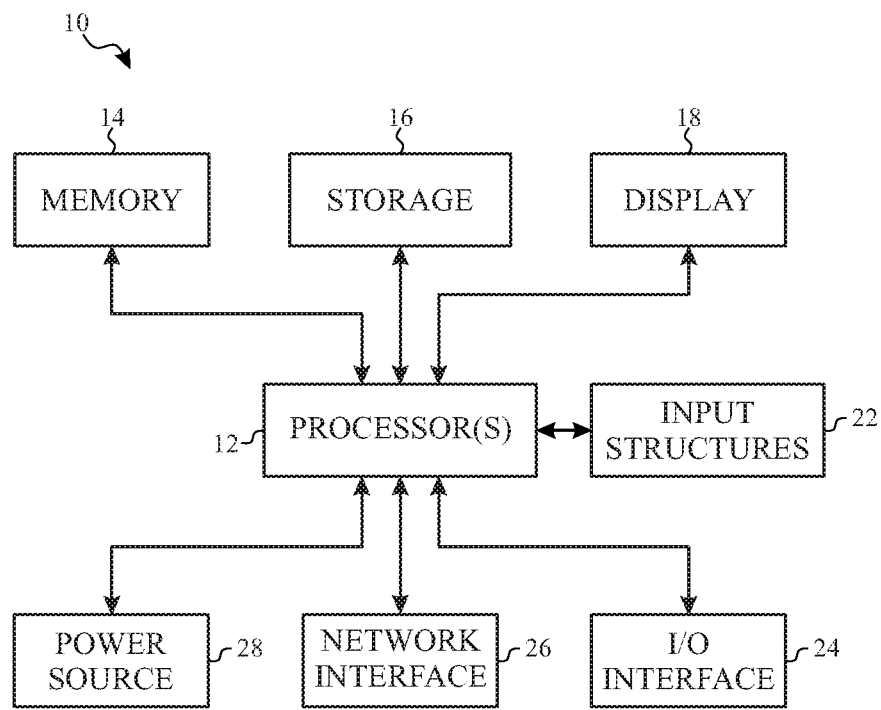
FIG. 1 is a diagram of an electrical device that may benefit from the inclusion of one or more components with reduced terminations, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Some of the described examples include devices that may have a right rectangular prism shape, a rectangular prism shape, or a rectangular cuboid. In the descriptions, references to faces and edges may refer to an orientation of the device with respect to its attachment to a printed circuit board. For example, a bottom of a device may refer to a face of the device that is in contact with the printed circuit board and a top of the device may refer to the opposite side. Note that a side of the device refers to a face of the device that is perpendicular to the surface of the printed circuit board.

Note further that an edge of the device refers to segment of lines formed between the corners of the device. For example, an edge formed between a side and the bottom of a device refers to the segment of line in the intersection between the bottom face and the side faced referred to. Moreover, when referring to rectangular prism shapes, the end sides refer to the faces that are formed in the short edge of the bottom face rectangle.

Many electrical systems may include PCBs that may employ electrical components. These electrical components, which may be integrated circuits or discrete electrical components, may be attached to the PCB by aligning the electrical terminations of the components to exposed conductor (e.g., pads) located in the PCB. Through soldering or some other method for fixation, electrical components may be included in electrical circuitries implemented in the PCB.

In some techniques for fixations, such as in surface-mount techniques (SMT), soldering may include addition of solder paste between the PCB and the electrical component followed by some soldering step, such as reflow-solder. In this process, unintended short-circuits between neighboring pads (e.g., solder bridging) may be formed accidentally. Note that this type of defect may be observed with other methods of fixation, such as manual soldering, wire soldering, solder ball techniques, and other similar methods. To reduce the risk of solder bridging the spacing between neighboring pads may be increased.

To increase the density of electrical components in a PCB, electrical components may employ electrical terminations such as the ones described herein. These electrical terminations may present dimensions that are reduced in comparison with the dimensions of the electrical component itself. These reduced dimension electrical terminations may allow smaller electrical pads. Since the tolerance distances to prevent solder bridging effects and similar effects is related to the distance between the conductive portions of the electrical components, the distance between the electrical components may be reduced, as detailed below.

Furthermore, embodiments described herein may include electrodes that may be used to facilitate the fabrication of components having terminations with reduced-dimensions described herein. Some of the examples provide may enable fabrication of components with reduced electrical terminations without parasite capacitances or other undesired effects that may result from the presence of corners in electrodes, as detailed below. Note that the electrodes presented herein may be used in the manufacture of component having reduced dimensions terminations or terminations that have a length substantially similar to the width of the component.

With the preceding in mind, a general description of suitable electronic devices that may include and use electrical components with reduced electrical terminations as described above is provided. FIG. 1 is a block diagram of an electronic device 10, in accordance with an embodiment of the present disclosure. The electronic device 10 may include, among other things, one or more processor(s) 12, memory 14, storage or nonvolatile memory 16, a display 18, input structures 22, an input/output (I/O) interface 24, network interface 26, and a power source 28. The various functional blocks shown in FIG. 1 may include hardware elements (including circuitry), software elements (including computer code stored on a computer-readable medium), or a combination of both hardware and software elements. Embodiments of electrical components with layout terminations as the ones described herein may be attached to PCBs in the circuitry of the various functional blocks of FIG. 1 to improve a performance of software and hardware elements. It should be noted that FIG. 1 is merely one example of a particular implementation and is intended to illustrate the types of components that may be present in electronic device 10.

Figure 2:
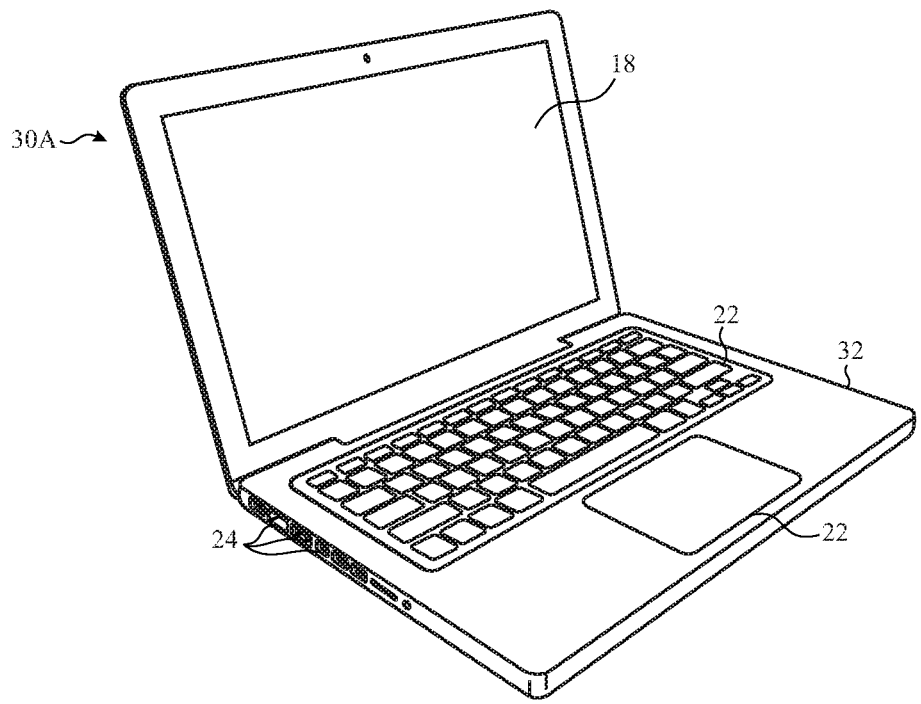
FIG. 2 is a perspective view of a notebook computer that may benefit from the inclusion of components with reduced terminations, in accordance with an embodiment.
Figure 3:
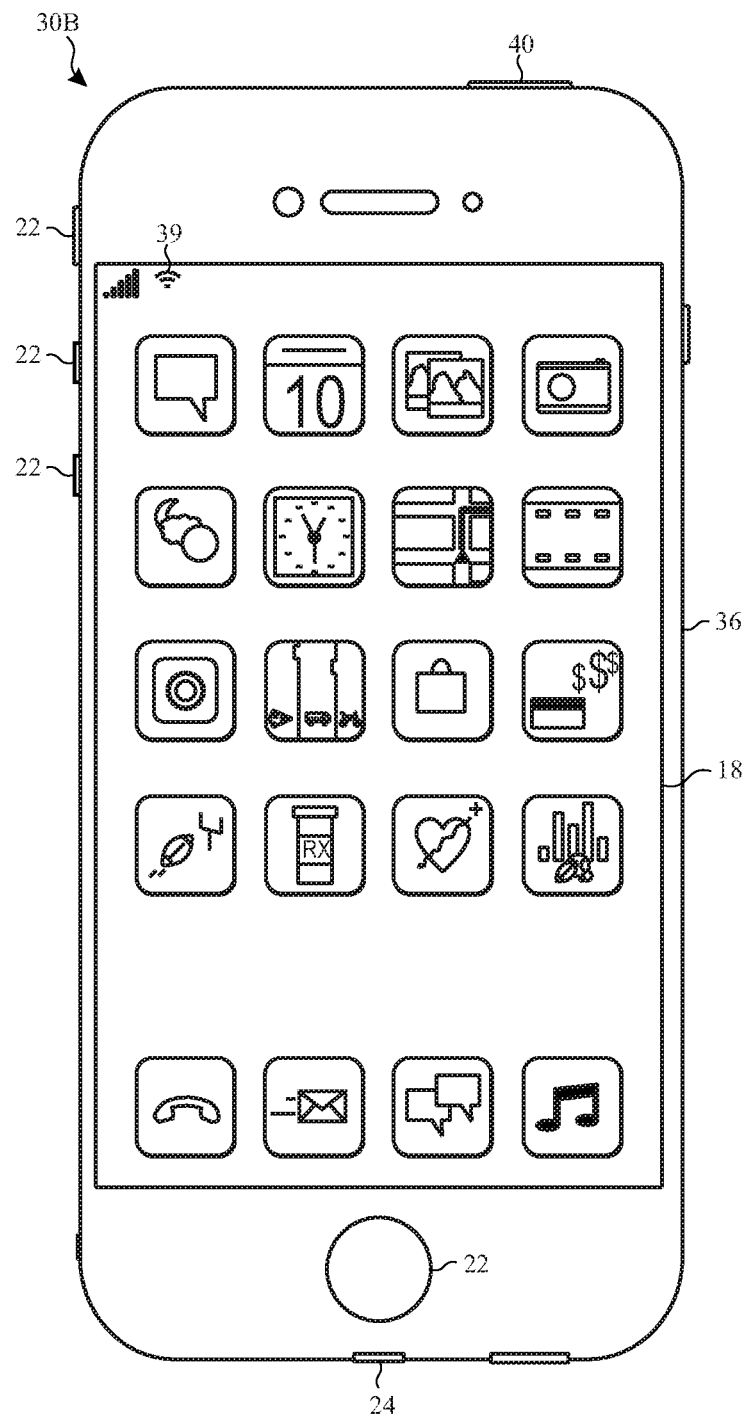
FIG. 3 is a front view of a hand-held device that may benefit from the inclusion of one or more components with reduced terminations, in accordance with an embodiment.
Figure 4:
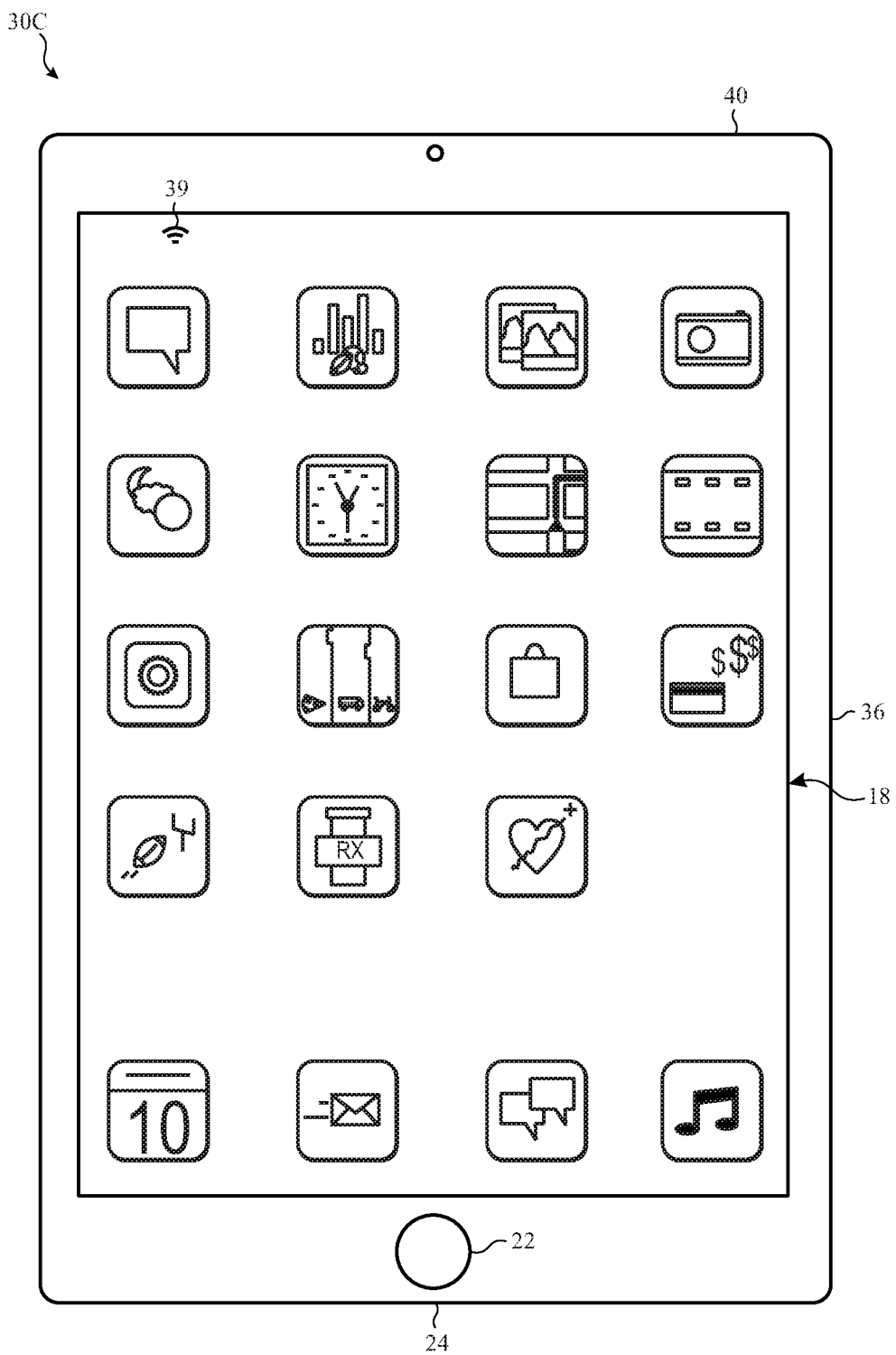
FIG. 4 is a front view of portable tablet computer that may benefit from the inclusion of one or more components with reduced terminations, in accordance with an embodiment.
Figure 5:
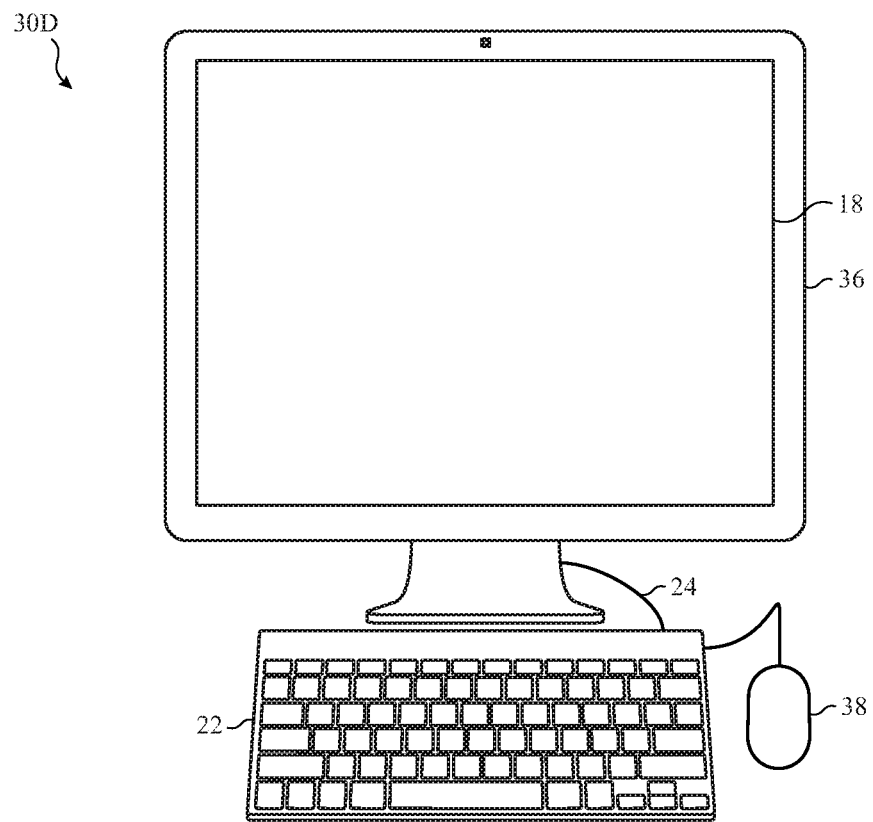
FIG. 5 is a diagram of a desktop computer that may benefit from the inclusion of one or more components with reduced terminations, in accordance with an embodiment.
Figure 6:
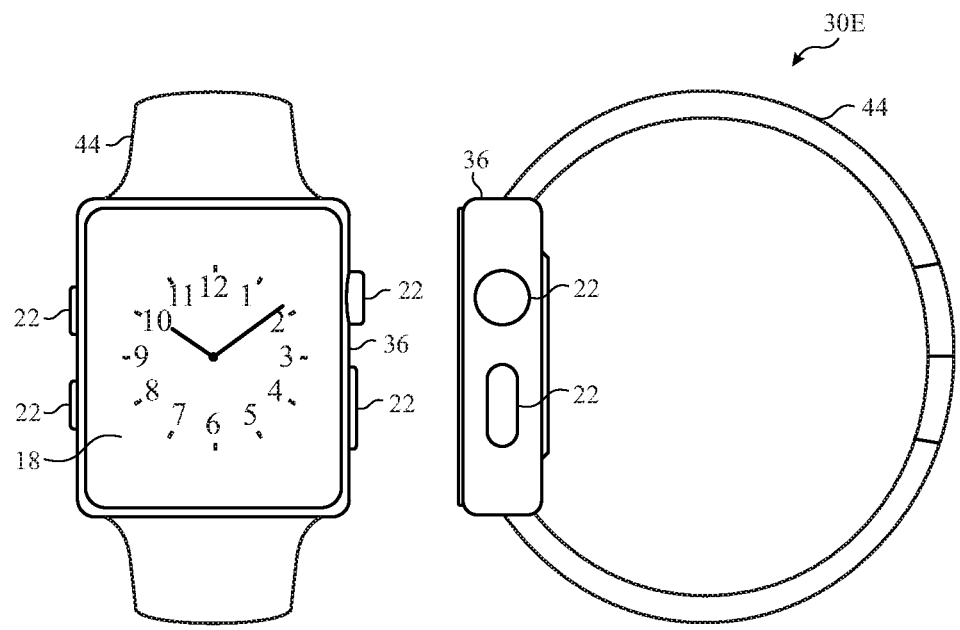
FIG. 6 presents a front and a side view of a wearable electrical device that may benefit from the inclusion of one or more components with reduced terminations, in accordance with an embodiment.

By way of example, the electronic device 10 may represent a block diagram of a notebook computer 30A depicted in FIG. 2, handheld devices 30B, 30C depicted in FIG. 3 and FIG. 4, a desktop computer 30D depicted in FIG. 5, a wearable electronic device 30E depicted in FIG. 6, or similar devices. It should be noted that the processor(s) 12 and/or other data processing circuitry may be generally referred to herein as "data processing circuitry." Such data processing circuitry may be embodied wholly or in part as software, firmware, hardware, or any combination thereof. Furthermore, the data processing circuitry may be a single contained processing module or may be incorporated wholly or partially within any of the other elements within the electronic device 10.

In the electronic device 10 of FIG. 1, the processor(s) 12 and/or other data processing circuitry may be operably coupled with the memory 14 and the nonvolatile storage 16 to perform various algorithms. Such programs or instructions executed by the processor(s) 12 may be stored in any suitable article of manufacture or computer program product that includes one or more tangible, computer-readable media at least collectively storing the instructions or routines, such as the memory 14 and the nonvolatile storage 16. The memory 14 and the nonvolatile storage 16 may include any suitable articles of manufacture for storing data and executable instructions, such as random-access memory, read-only memory, rewritable flash memory, hard drives, and optical discs. Moreover, programs (e.g., an operating system) encoded on the memory 14 or the nonvolatile storage 16 may also include instructions that may be executed by the processor(s) 12 to allow the electronic device 10 to provide various functionalities.

In certain embodiments, the display 18 may be a liquid crystal display (e.g., LCD), which may allow users to view images generated on the electronic device 10. In some embodiments, the display 18 may include a touch screen, which may allow users to interact with a user interface of the electronic device 10. Furthermore, it should be appreciated that, in some embodiments, the display 18 may include one or more light emitting diode (e.g., LED, OLED, AMOLED, etc.) displays, or some combination of LCD panels and LED panels.

The input structures 22 of the electronic device 10 may allow a user to interact with the electronic device 10 (e.g., pressing a button to increase or decrease a volume level). The I/O interface 24 may allow electronic device 10 to interface with various other electronic devices. The I/O interface 24 may include various communications interfaces, such as universal serial bus (USB) ports, serial communications ports (e.g., RS232), Apple's Lightning® connector, or other communications interfaces. The network interface 26 may also allow electronic device 10 to interface with various other electronic devices and may include, for example, interfaces for a personal area network (e.g., PAN), such as a Bluetooth network, for a local area network (e.g., LAN) or wireless local area network (e.g., WLAN), such as an 802.11x Wi-Fi network, and/or for a wide area network (e.g., WAN), such as a $3^{rd}$ generation (e.g., 3G) cellular network, $4^{th}$ generation (e.g., 4G) cellular network, or long term evolution (e.g., LTE) cellular network. The network interface 26 may include an interface for, for example, broadband fixed wireless access networks (e.g., WiMAX), mobile broadband Wireless networks (e.g., mobile WiMAX), asynchronous digital subscriber lines (e.g., ADSL, VDSL), digital video broadcasting-terrestrial (DVB-T) and its extension DVB Handheld (DVB-H), Ultra-Wideband (UWB), alternating current (AC) power lines, and so forth.

As further illustrated, the electronic device 10 may include a power source 28. The power source 28 may include any suitable source of power, such as a rechargeable lithium polymer (e.g., Li-poly) battery and/or an alternating current (e.g., AC) power converter. The power source 28 may be removable, such as replaceable battery cell.

In certain embodiments, the electronic device 10 may take the form of a computer, a portable electronic device, a wearable electronic device, or other type of electronic device. Such computers may include computers that are generally portable (e.g., such as laptop, notebook, and tablet computers) as well as computers that are generally used in one place (e.g., such as conventional desktop computers, workstations and/or servers). In certain embodiments, the electronic device 10 in the form of a computer may be a model of a MacBook®, MacBook® Pro, MacBook Air®, iMac®, Mac® mini, or Mac Pro® available from Apple Inc. By way of example, the electronic device 10, taking the form of the notebook computer 30A, is illustrated in FIG. 2 in accordance with an embodiment of the present disclosure. The depicted computer 30A may include a housing or enclosure 32, a display 18, input structures 22, and ports of the I/O interface 24. In one embodiment, the input structures 22 (e.g., such as a keyboard and/or touchpad) may be used to interact with the computer 30A, such as to start, control, or operate a GUI or applications running on computer 30A.

For example, a keyboard and/or touchpad may allow a user to navigate a user interface or application interface displayed on display 18.

FIG. 3 depicts a front view of a handheld device 30B, which represents an embodiment of the electronic device 10. The handheld device 30B may represent, for example, a portable phone, a media player, a personal data organizer, a handheld game platform, or any combination of such devices. By way of example, the handheld device 30B may be a model of an iPod® or iPhone® available from Apple Inc. of Cupertino, Calif. FIG. 4 depicts a front view of another handheld device 30C, which represents another embodiment of the electronic device 10. The handheld device 30C may represent, for example, a tablet computer, or one of various portable computing devices. By way of example, the handheld device 30C may be a tablet-sized embodiment of the electronic device 10, which may be, for example, a model of an iPad® available from Apple Inc. of Cupertino, Calif.

The handheld devices 30B and 30C may each include similar components. For example, an enclosure 36 may protect interior components from physical damage. Enclosure 36 may also shield the handheld devices 30B and 30C from electromagnetic interference. The enclosure 36 may surround the display 18, which may display indicator icons 39. The indicator icons 39 may indicate, among other things, a cellular signal strength, Bluetooth connection, and/or battery life. The I/O interfaces 24 may open through the enclosure 36 and may include, for example, an I/O port for a hard wired connection for charging and/or content manipulation using a connector and protocol, such as the Lightning connector provided by Apple Inc., a universal service bus (e.g., USB), one or more conducted radio frequency connectors, or other connectors and protocols.

User input structures 22, 40, in combination with the display 18, may allow a user to control the handheld devices 30B or 30C. For example, the input structure 40 may activate or deactivate the handheld device 30B or 30C, one of the input structures 22 may navigate a user interface of the handheld device 30B or 30C to a home screen, a user-configurable application screen, and/or activate a voice-recognition feature of the handheld device 30B or 30C, while other of the input structures 22 may provide volume control, or may toggle between vibrate and ring modes. In the case of the handheld device 30B, additional input structures 22 may also include a microphone may obtain a user's voice for various voice-related features, and a speaker to allow for audio playback and/or certain phone capabilities.

Turning to FIG. 5, a computer 30D may represent another embodiment of the electronic device 10 of FIG. 1. The computer 30D may take any suitable form of computer, such as a desktop computer, a server, or a notebook computer, but may also be a standalone media player or video gaming machine. By way of example, the computer 30D may be an iMac®, a MacBook®, or other similar device by Apple Inc. It should be noted that the computer 30D may also represent a personal computer (e.g., PC) by another manufacturer. A similar enclosure 36 may be provided to protect and enclose internal components of the computer 30D such as a dual-layer display. In certain embodiments, a user of the computer 30D may interact with the computer 30D using various peripheral input devices, such as input structures 22 (e.g., the keyboard or mouse 38), which may connect to the computer 30D via a wired I/O interface 24 and/or wireless I/O interface.

Similarly, FIG. 6 depicts a wearable electronic device 30E representing another embodiment of the electronic device 10 of FIG. 1 that may be configured to operate using the techniques described herein. By way of example, the wearable electronic device 30E, which may include a wristband 44, may be an Apple Watch® by Apple, Inc. However, in other embodiments, the wearable electronic device 30E may include any wearable electronic device such as, for example, a wearable exercise monitoring device (e.g., pedometer, accelerometer, heart rate monitor), or other device by another manufacturer. The display 18 of the wearable electronic device 30E may include a touch screen (e.g., LCD, OLED display, active-matrix organic light emitting diode (e.g., AMOLED) display, and so forth), which may allow users to interact with a user interface of the wearable electronic device 30E.

Figure 7:
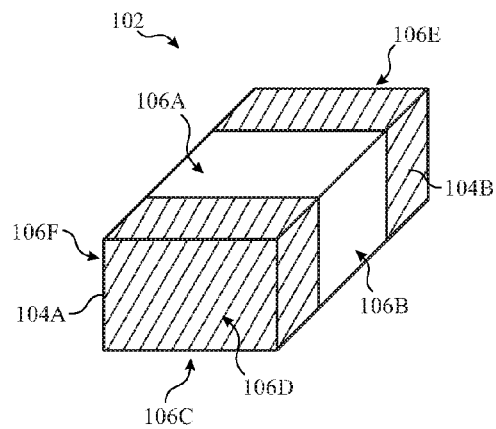
FIG. 7 presents a perspective view of a two-terminal component having terminations that disposed along 5 sides and may employ reduced-tip electrodes, in accordance with an embodiment.

With the preceding in mind, FIG. 7 illustrates a perspective view of a two-terminal component 102 that may employ some of the electrode layouts detailed below. The two-terminal component 102 may have two electrical terminations 104A and 104B. Each of the terminations 104A and 104B is formed along 5 faces of the device. For example, termination 104A may be formed along a top 106A, sides 106B and 106F, a bottom 106C, and an end 106D. Termination 104B may be formed along the opposite end 106E and along top 106A, sides 106B and 106F, and bottom 106C.

Two-terminal component 102 may be any type of component such as a resistor, a capacitor, an inductor, a diode, a memristor or any other type of two-terminal component. Two-terminal component 102 may be soldered to a printed circuit board using a surface-mount technology, welding. In some implementations, terminations 104A and 104B may be provided with a solder ball or a solder paste, for ease of placement and assembly to a printed circuit board.

Figure 8:
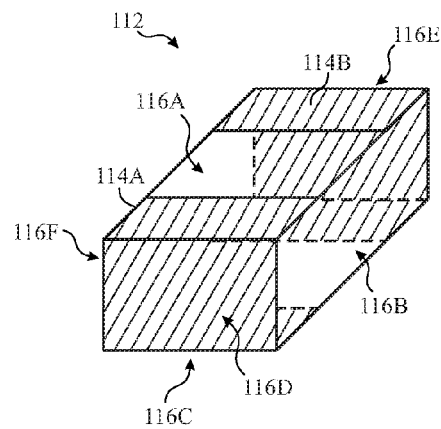
FIG. 8 presents a perspective view of a two-terminal component having terminations disposed along 3 sides and may employ reduced-tip electrodes, in accordance with an embodiment.

Another example of a termination layout that may be used with electrodes detailed below includes two-terminal component 112 of FIG. 8. Two-terminal component 112 may have terminations 114A and 114B that are formed along 3 faces of the device. For example, termination 114A may be formed along top 116A, bottom 116C and end 116D and termination 114B may be formed along top 116A, bottom 116C, and end 116E. Note that the sides 116B and 116F are not covered with any metallization in this example. This may prevent a build-up of residual soldering materials along sides 116B and 116F of the two-terminal component 112 and reduce the chance of solder bridging.

Figure 9:
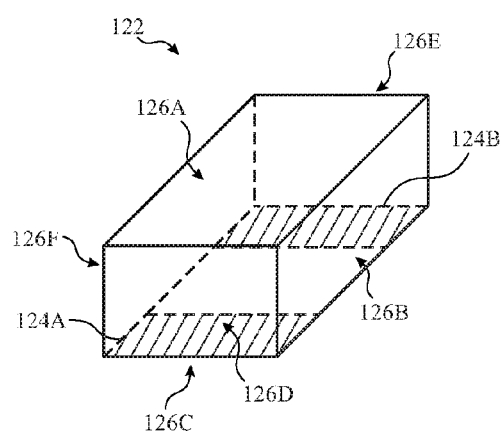
FIG. 9 presents a perspective view of a two-terminal component having terminations disposed along the bottom of the component and may employ reduced-tip electrodes, in accordance with an embodiment.

The two-terminal component 122 illustrated in FIG. 9 is another example of a component that may be mounted to a printed circuit board. In this example, two-terminal component 122 may include terminations 124A and 124B that may be formed along the bottom 126C of the two-terminal component 122. Note that the termination 124A is formed along the terminal edge 128A that is formed between bottom 126C and end 126D. Similarly, termination 124B may extend along the terminal edge 128B, is formed between bottom 126C and end 126E. As a result, top 126A, sides 126B and 126F, and ends 126D and 126E are not covered with any metallization in this example. As mentioned above, this feature may prevent a build-up of residual soldering materials along sides 126B and 126F, and ends 126D and 126E of the two-terminal component 122 and reduce the chance of solder bridging.

Figure 10:
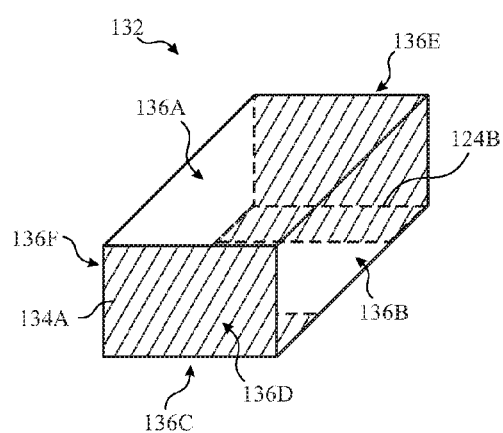
FIG. 10 presents a perspective view of a two-terminal component having terminations along 2 sides and may employ reduced-tip electrodes, in accordance with an embodiment.

Another example of a termination layout that extends through an entire width of a two-terminal component 132 is illustrated in FIG. 10. The terminations 134A and 134B of the two-terminal component 132 may be formed along the bottom 136C. Moreover, termination 134A is formed along end 136D and termination 134B is formed along end 136E. Top 136A and sides 136B and 136F are not covered with any metallization in this example, which may prevent undesired build-up of residual materials during the attachment process as discussed above. While some of the above examples may be benefitted by the utilization of the electrodes as detailed below and may reduce some solder bridging, the solder bridging may be further reduce through a reduction of a width of the termination, as detailed below.

Figure 11:
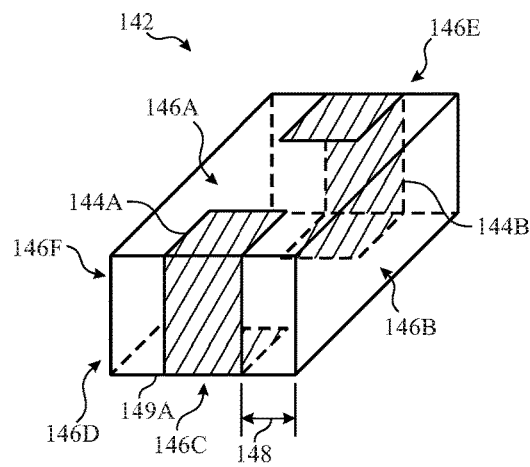
FIG. 11 presents a perspective view of a two-terminal component having filleted terminations along three sides, in accordance with an embodiment.

For example, two-terminal component 142 illustrated in FIG. 11 illustrates an example of an electrical component having reduced termination dimensions. Two-terminal component 142 may have a termination 144A that is formed along a top 146A, a bottom 146C, and an end 146D, and a second termination 144B that is formed along top 146A, a bottom 146C, and an end 146E. Sides 146B and 146F are not covered with any metallization, which, as discussed above, may prevent undesired build-up of residues in along the sides 146B, and 146F of the two-terminal component 142.

Note, moreover, that a width of termination 144A is smaller than the length of the edge 149A formed between bottom 146C and end 146D. Note that the width is measured along edge 149A. For example, the length of termination 144A may be 10%, 25%, 50%, or 75% of edge 149A. Note that the distance 148 resulting from the differences between the width of termination 144A and the length of edge 149A lead to at least one region along the bottom 146C and end 146D that is not covered by any metallization. The dimensions of termination 144A may also be observed in termination 144B. As a result of these filleted terminations (e.g., reduced-dimension termination, thinner terminations), the pad on a PCB to which the two-terminal component 142 is to be attached to can be smaller, which may allow an increase in the component density of the PCB, as detailed below.

Figure 12:
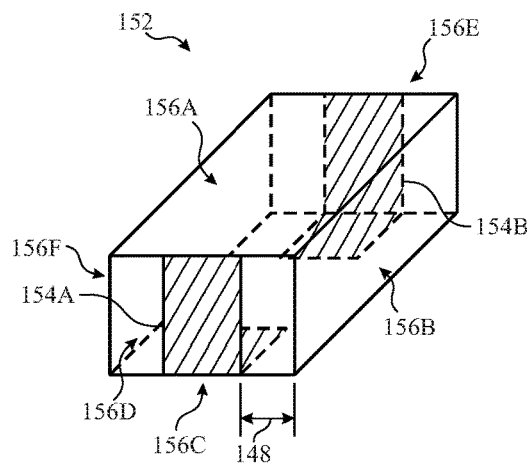
FIG. 12 presents a perspective view of a two-terminal component having filleted terminations along two sides, in accordance with an embodiment.

Another two-terminal component 152 with filleted terminations is illustrated in FIG. 12. Filleted terminations 154A and 154B may be formed along bottom 156B. Filleted termination 154A is also formed along an end 156D and filleted termination 154B is also formed along end 156E. Top 156A and sides 156B and 156F are not covered with any metallization in this example, which may prevent undesired build-up of residual materials during the attachment process as discussed above. As with two-terminal component 142, the pad to which two-terminal component 152 may employ a pad on a PCB with reduced dimensions, which may allow increase in the component density of the PCB.

Figure 13:
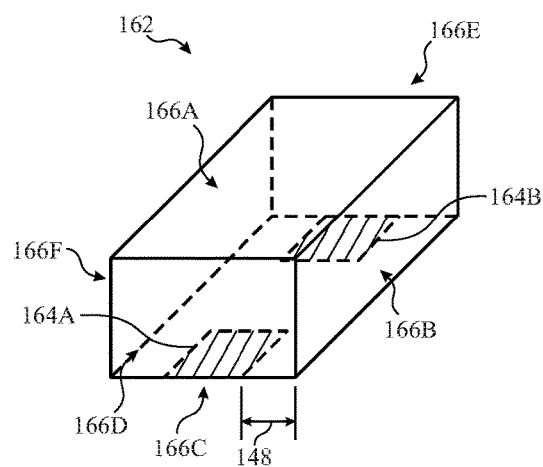
FIG. 13 presents a perspective view of a two-terminal component having filleted terminations along the bottom of the component and may employ reduced-tip electrodes, in accordance with an embodiment.

Finally, two-terminal component 162 in FIG. 13 illustrates a layout for a component having filleted terminations 164A and 164B that are formed only along bottom 166B. In this example, top 166A, sides 166C and 166F, and ends 166D and 166E are not covered with any metallization from the termination to prevent build-up that may lead to solder bridging. Moreover, the filleted termination 164A and 164B may present a distance 148 from the corner, which may lead to an increase in the density of components in a printed circuit board, as discussed below.

Figure 14:
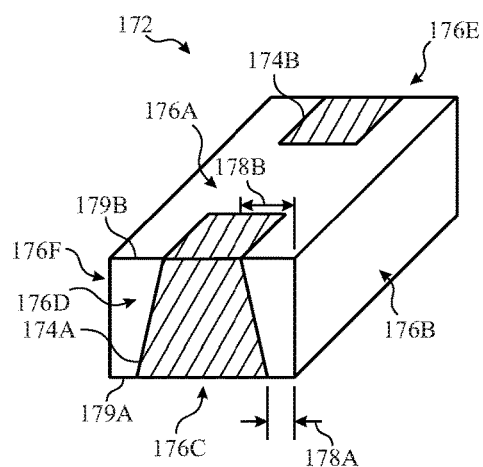
FIG. 14 presents a perspective view of a two-terminal component having trapezoidal shaped terminations, in accordance with an embodiment.

Two-terminal component 172 of FIG. 14 illustrates a component having a trapezoidal arrangement for terminations 174A and 174B. The portion of termination 174A along top 176A may be rectangular portion. Similarly, the portion of termination 174A along bottom 176C may also be a rectangular portion. The portion of termination 174A along end 176D may be a trapezoidal shape. As a result the distance between the width of termination 174A and the width of the two-terminal component 172 may lead to a separation 178A along edge 179A that may be smaller than separation 178B along edge 179B. This tapering of a dimension of termination 174A may provide further control of the build-up of residues during the soldering process, and may lead to improved electrical performance in circumstances where another component may be stacked above two-terminal component 172.

Figure 15:
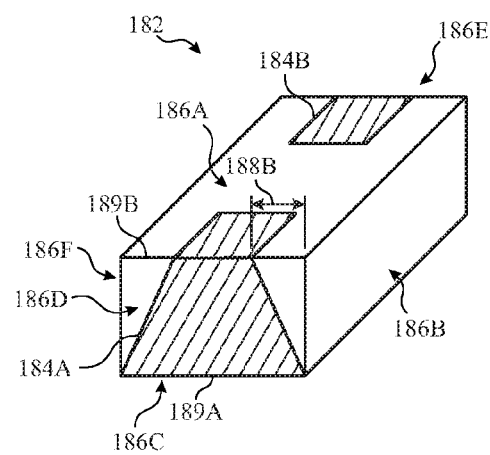
FIG. 15 presents a perspective view of an alternative layout for a two-terminal component having trapezoidal shaped terminations, in accordance with an embodiment.

Two-terminal component 182 of FIG. 15 illustrates another design for a component having a trapezoidal arrangement for termination 184A and 184B. As illustrated, the termination 184A may have a width that is flush with edge 189A. Note however, that the difference between the width of termination 184A and the length of edge 189B leads to a distance 188. As discussed above, the tapering of a dimension of termination 184A may provide control over the residues from attachment processes, and may lead to more flexible assembly methods, such as stacking of components. Note that the tapering in the examples 172 and 182 may be inverted (e.g., termination thinner at the bottom than at the top), to allow for a reduced electrical pad in a PCB and a wider region on the top for stacking or other type of assembly electrical coupling.

Figure 16:
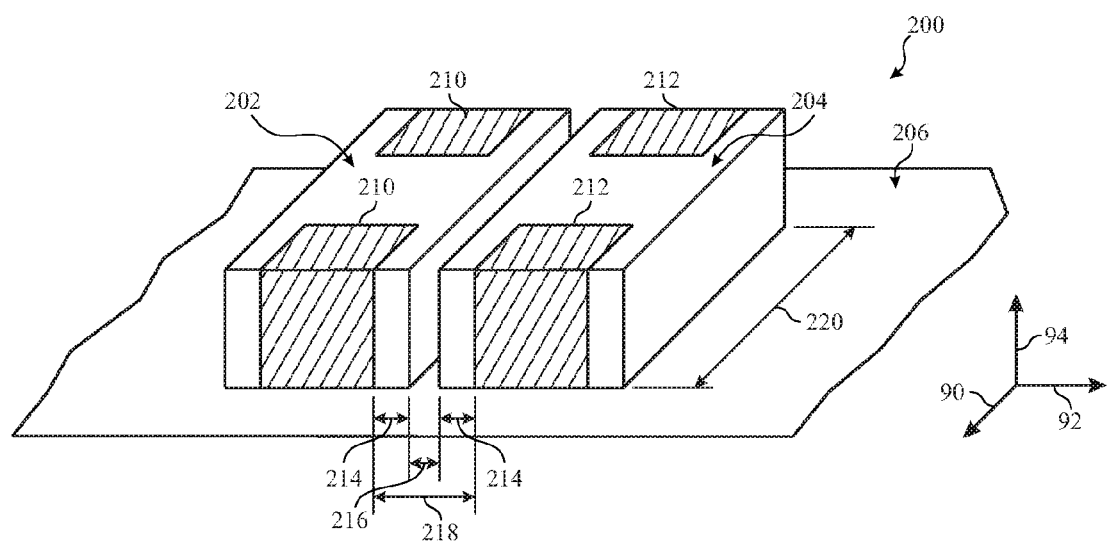
FIG. 16 presents a perspective view an example of printed circuit board having two mounted two-terminal components such as the one of FIG. 13, in accordance with an embodiment.

The arrangement 200 of FIG. 16 illustrates two electrical components 202 and 204 attached to a PCB 206. Electrical component 202 presents filleted terminations 210 and electrical component 204 presents filleted terminations 212. As discussed above, filleted terminations 210 and 212 provide a distance 214 between the end of a terminations 210 and 212, and the corner of the corresponding electrical components 202 and 204. This distance 214 may allow increased density of components through reduction of separation 216 between the components, as detailed below.

A tolerance margin 218 based on a minimal metal-to-metal distance between adjacent components may be established in the design process to prevents solder bridging from occurring. The narrower dimensions of the filleted termination 212 compared to a width of electrical components 202 and 204 provides a distance 214 between the corner of the component and the exposed metal relevant to the tolerance margin. As a result, the separation 216 between the electrical components 202 and 204 may be smaller than the tolerance margin 218, while still maintaining the minimal metal-to-metal distance between filleted termination 210 and filleted termination 212. For example, if distance 214 in components 202 and 204 is 25 µm and the tolerance margin 218 is 75 µm the separation 216 may be 25 µm, which is 50 µm smaller than the tolerance margin 218.

As a further example of potential space-saving characteristic, consider a system having N electrical components devices similar to components 210 and 212. Consider further that each of the components have a length 220 equal to L. Assuming that the separation 216 is represented by T, and the tolerance margin 218 is represented by D, the use of components 210 and 212 having a distance 214 between the end of the termination and a corner, the area saved by using filleted terminations 210 may be equal to $A=((D-T)*L)*(N-1)$.

With the preceding in mind, FIG. 17 illustrates a method 350 to assemble circuitries using surface mount two-terminal components with filleted terminations as the ones described in FIGS. 11-15. In a process inclusive of the method 350, a PCB may be designed to include electrical pads disposed to take into account the reduced spacing requirements discussed above (step 352). The dimensions of the electric pads may also be adjusted based on the dimensions of the filleted terminations.

A solder paste may be applied to the electrical pads in another process (step 354). This process may be adjusted based on alternative methods for soldering. For example, components may be provided with solder balls. Components may be then positioned above the designated positions such that the terminations align with the electrical pads (step 356). As noted above, the distance between neighboring components may be reduced compared to the distance for components that do not include filleted terminations. The printed circuit board with the components may then undergo a reflow-solder process to attach the components to the PCB (step 358). It should be understood that the above-described method 350 may be used to produce circuitries having reduced spacing between components provided with filleted terminations.

The two-terminal electrical components described in FIGS. 7-15 may be constructed using methods such as multilayer ceramic techniques. In these methods, sheets of ceramic may be stenciled in certain portions with a conductive material to form electrodes. Based on the desired role of the component (e.g, resistor, capacitor, inductor), ceramic sheets stenciled with the appropriate electrodes may be produced and stacked to form an electrical component. In order to provide a termination, electrodes may be stenciled such that an electrode may reach a boundary of the ceramic layer and provide a contact region. Electrical components having filleted terminations, such as the ones discussed above, may benefit from a narrow contact region to reduce fabrication defects, and unintended short circuits.

The layout 400 in FIG. 18 illustrates a ceramic layer 402 having a stenciled electrode 404. Electrode 404 may have a lip 406 at an end of the ceramic layer to provide a contact region. Note that the width of the lip 406 is significantly smaller than the width of the ceramic layer 402. The lip 406 may, alternatively, be as large as the entire width of the ceramic layer 402, based on the width of the metallic termination to be provided. Note that electrode 404 include sharp corners 408 and 410. This layout 400 may be used to produce a two-terminal capacitor by using multiple stenciled sheets interleaved with dielectric sheets. This layout 400 may also be used to produce inductors and resistors, by a stack of sheets in which the electrodes are connected to obtain the desired electrical behavior (i.e., inductance and/or resistance).

The presence of sharp corners 404 and 408 may lead to an increased in parasitic inductances, capacitances or resistances, as it may interfere with the flux of electrons during operation of the component. Layout 420 in FIG. 19 illustrates a ceramic layer 422 with an electrode 424 having a lip 426. The width of lip 426 may be substantially similar to that of lip 406. Note further that that the electrode 424 include curved corners 428 and 430, which may reduce parasitic effects, as discussed above.

Figure 20A:
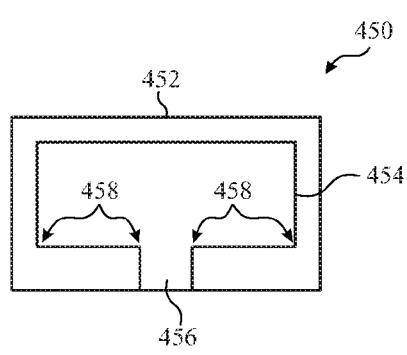
FIGS. 20A and 20B present layouts of reduced tip electrodes that may be used to produce a capacitor with termination layouts similar to the ones illustrated in FIGS. 1-15, in accordance with an embodiment.
Figure 20B:
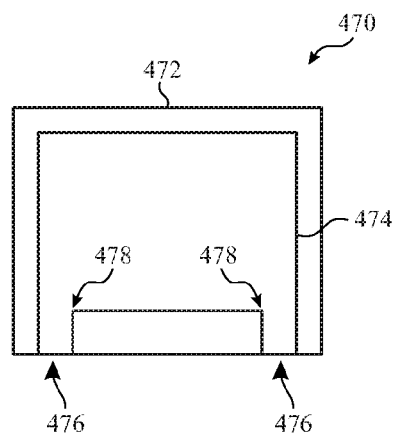

Layouts 450 of FIG. 20A and 470 of FIG. 20B provide additional examples of ceramic layers 452 and 472, respectively, that may be used to form a capacitor. Ceramic layer 452 may have an electrode 454 that has a lip 456 to produce a termination. Ceramic layer 472 may include an electrode 474 having lips 476 that may be used to produce other terminations. By interleaving ceramic layers 452 and 472 with dielectric layers, it is possible to forma a multilayer ceramic capacitor (MLCC) with filleted terminations. Note that based on the arrangement of the electrodes, this capacitor may have a central termination (location of lip 456) connected to electrodes 454, and corner terminations (location of lips 476). All locations may be extended along the bottom of the formed capacitor.

Figure 21A:
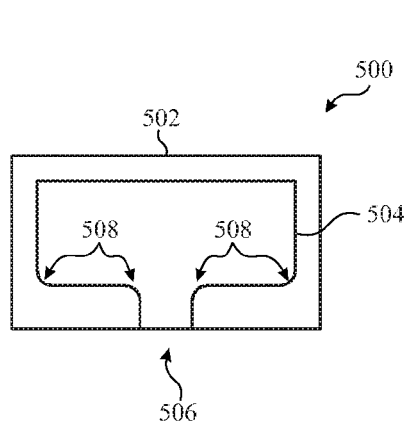
FIGS. 21A and 21B present a second set of layouts of reduced tip electrodes that may be used to produce a capacitor with termination layouts similar to the ones illustrated in FIGS. 1-15, in accordance with an embodiment.
Figure 21B:
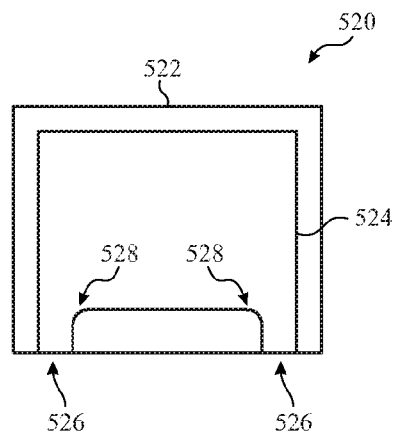

Electrodes 454 and 474 may have sharp corners 458 and 478. As discussed above, sharp corners may lead to undesired behavior. Layouts 500 of FIG. 21A and 520 of FIG. 20B provide an alternative design for electrodes 504 and 524 located in ceramic layers 502 and 522 that employ rounded corners 508 and 528. Note that electrodes 504 and 524 have lips 506 and 526, respectively, which are located in regions similar to lips 456 and 476 of layouts 450 and 470, respectively.

An additional layout 550 for a two-terminal multilayer ceramic component is illustrated in FIG. 22. The ceramic layer 552 may have an electrode 554 with lip 556. As noted above, lip 556 is reduced in width with respect to a width of the ceramic layer 556. In this layout 550, the shape of the ceramic layer 552 is square. This square ceramic layer 552 allows for a rounded electrode 554 with no straight edges, which may reduce undesired effects such as parasitic capacitances and/or inductances.

Layout 570 in FIG. 23 may to produce a multi-terminal component having filleted terminations. Ceramic layer 572 may be stenciled with an electrode 574, which may have rounded corners 576. Moreover, ceramic layer 572 presents lips 578A-D that may be used to form filleted terminations.

As described above, in some implementations, electrical components may be stacked above the two-terminal components described herein. Two-terminal component 602 illustrated in FIG. 24 illustrates a layout for terminations 604A and 604B that may facilitate stacking. Specifically, top portion 606 of termination 604A and top portion 608 of termination 604B may be longer than the bottom portion 610 of termination 604A and bottom portion 612 of termination 604B. Note that these terminations may have the filleted profile (e.g., a narrow termination), as discussed above. This design may allow for a more solid support for a component soldered to the top portions 606 and 608 of two-terminal component 602 and increased density by having smaller bottom portions 610 and 612.

The systems and methods described in this disclosure may improve the density of components in a printed circuit board, which may ultimately lead to a reduction in size of electrical devices employing this system. Moreover, performance of the electrical device may improve due to reduction in parasitic effects due to the characteristics of the devices described herein.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An electrical component comprising:
   a first electrical termination disposed along a bottom of the electrical component, a first terminal edge of the electrical component that abuts a first end of the electrical component and the first end of the electrical component extending to a third terminal edge of the electrical component that abuts a top of the first electrical component, wherein a first portion of the first electrical termination disposed in the first end of the electrical component comprises a trapezoidal shape; and a second electrical termination disposed along the bottom of the electrical component and extending to a second terminal edge of the electrical component that abuts a second end of the electrical component opposite to the first end of the electrical component, wherein the first electrical termination is disposed at a first distance from a first and a second corner of the first terminal edge, the first distance corresponding to at least 10% of a total length of the first terminal edge, wherein the first distance is measured along the first terminal edge and the first electrical termination is disposed at a second distance from a third and a fourth end of the third terminal edge, wherein the second distance is smaller than the first distance, and wherein the second distance is measured along the third terminal edge.

2. The electrical component of claim 1, wherein the trapezoidal shape of the first portion of the first electrical termination is substantially similar to a shape of a second portion of the second electrical termination disposed in the second end of the electrical component.

3. The electrical component of claim 1, wherein the first electrical termination extends contiguously along the first end and the top of the electrical component.

4. The electrical component of claim 1, wherein the electrical component is configured to be mounted to a printed circuit board (PCB) using a surface-mount technique (SMT).

5. The electrical component of claim 1, wherein the electrical component comprises a multilayer ceramic capacitor.

6. The electrical component of claim 1, wherein a width of the first electrical termination along the first terminal edge is 50 μm smaller than the total length of the first terminal edge.

7. The electrical component of claim 1, wherein the first electrical termination covers the third terminal edge.

8. A multilayer ceramic capacitor comprising:

a first electrical termination disposed along a bottom and a first end of the multilayer ceramic capacitor, wherein a first region of the first electrical termination disposed in the first end of the multilayer ceramic capacitor comprises a first terminal edge that abuts the bottom of the multilayer ceramic capacitor and a second terminal edge that abuts a top of the multilayer ceramic capacitor, wherein a first width of the first electrical termination along the first terminal edge is smaller than a second width of the first electrical termination along the second terminal edge to form a first trapezoidal shape, wherein the first width is less than 80% of an edge width of the multilayer ceramic capacitor along the first terminal edge, and wherein the first electrical termination is the only termination contacting the first end of the multilayer ceramic capacitor; and a second electrical termination disposed along the bottom and a second end of the multilayer ceramic capacitor, wherein a second region of the second electrical termination disposed in the second end of the multilayer ceramic capacitor comprises a third terminal edge that abuts the bottom of the multilayer ceramic capacitor and a fourth terminal edge that abuts the top of the multilayer ceramic capacitor, and wherein a third width of the second electrical termination along the third terminal edge is smaller than a fourth width of the second electrical termination along the fourth terminal edge to form a second trapezoidal shape;

a first layer comprising a first electrode, wherein the first electrode comprises a first lip coupled to the first electrical termination along a first electrode edge of the first layer; and a second layer comprising a second electrode, wherein the second electrode comprises a second lip coupled to the second electrical termination along a second electrode edge of the second layer, wherein a dimension of the first lip measured along the first electrode edge is less than a total length of the first electrode edge and a second dimension of the second lip measured along the second electrode edge is less than a total length of the second electrode edge.

9. The multilayer ceramic capacitor of claim 8, wherein the first electrode comprises rounded corners.

10. The multilayer ceramic capacitor of claim 8, wherein the second electrode comprises a third lip coupled to the second electrical termination along the second electrode edge of the second layer.

11. The multilayer ceramic capacitor of claim 8, wherein the first layer is disposed in a plane parallel to the bottom of the multilayer ceramic capacitor.

12. The multilayer ceramic capacitor of claim 8, wherein the first layer is disposed in a plane perpendicular to the bottom of the multilayer ceramic capacitor.

13. The multilayer ceramic capacitor of claim 8, wherein the first electrical termination comprises a third region along the bottom of the multilayer ceramic capacitor and a fourth region along the top of the multilayer ceramic capacitor, the second electrical termination comprises a fifth region along the bottom of the multilayer ceramic capacitor and a sixth region along the top of the multilayer ceramic capacitor, and the multilayer ceramic capacitor is configured to mount to a printed circuit board through coupling of the third and the fifth region, and the multilayer ceramic capacitor is configured to mount to an electrical component through the fourth region and the sixth region.

14. The multilayer ceramic capacitor of claim 8, wherein the second width of the first electrical termination along the second terminal edge is similar to a width of the multilayer ceramic capacitor measured along the second terminal edge.

15. An electrical device, comprising:

a printed circuit board comprising a first electrical pad and a second electrical pad; and a component comprising:

a first electrical termination electrically coupled to the first electrical pad, disposed along a bottom of the component, a first terminal edge of the component that abuts a first end of the component, and the first end of the component extending to a third terminal edge of the component that abuts a top of the component, and wherein a first portion of the first electrical termination disposed in the first end of the component comprises a trapezoidal shape the first electrical termination is disposed at a first distance from a first and a second corner of the first terminal edge measured along the first terminal edge, the first distance corresponds to at least 10% of a total length of the first terminal edge, the first electrical termination is disposed at a second distance from a third and a fourth corner of the third terminal edge measured along the third terminal edge, and the second distance is smaller than the first distance; and a second electrical termination electrically coupled to the second electrical pad, disposed along the bottom of the component, and extending to a second terminal edge of the component that abuts a second end of the component opposite to the first end of the component.

16. The electrical device of claim 15, wherein a first width of the first electrical pad is substantially similar to a second width of the first electrical termination measured along the first terminal edge.

17. The electrical device of claim 15, wherein the component comprises a multilayer ceramic capacitor.

18. The electrical device of claim 15, wherein the component is electrically coupled to the printed circuit board using a surface-mount technique (SMT).

* * * * *